US012764895B2

(12) United States Patent
Shah et al.

(10) Patent No.: US 12,764,895 B2
(45) Date of Patent: Oct. 13, 2026

(54) COOLING SYSTEMS FOR COMPUTER EQUIPMENT CABINETS

(71) Applicant: Vertiv Corporation, Columbus, OH (US)

(72) Inventors: Akshay Shah, Khonchwa Khubol (IN); Srinivasan Natarajan, Nagar Thavittupalayam Anthiyur (IN); Jin Elkins, Auburn, AL (US)

(73) Assignee: Vertiv Corporation, Westerville, OH (US)

( * ) Notice: Subject to any disclaimer, the term of this patent is extended or adjusted under 35 U.S.C. 154(b) by 561 days.

(21) Appl. No.: 18/335,066

(22) Filed: Jun. 14, 2023

(65) Prior Publication Data

US 2023/0422428 A1 Dec. 28, 2023

(30) Foreign Application Priority Data

Jun. 23, 2022 (IN) ............................ 202221036139

(51) Int. Cl.
*H05K 7/20* (2006.01)

(52) U.S. Cl.
CPC ..... *H05K 7/20145* (2013.01); *H05K 7/20736* (2013.01)

(58) Field of Classification Search
CPC ....................... H05K 7/20145; H05K 7/20836
USPC .......................................................... 454/184
See application file for complete search history.

(56) References Cited

U.S. PATENT DOCUMENTS 6,506,111 B2 1/2003 Sharp et al.
7,226,353 B2 * 6/2007 Bettridge ........... H05K 7/20736 361/695
7,342,788 B2 3/2008 Nikfar
7,699,180 B2 4/2010 Mollard et al.
7,895,855 B2 3/2011 Gooch
8,113,478 B2 2/2012 Hsiao
8,659,895 B1 * 2/2014 Carlson .............. H05K 7/20745 361/695
9,398,717 B2 7/2016 Englert et al.
9,480,176 B2 10/2016 Englert et al.
10,180,261 B1 * 1/2019 Ross ........................ F24F 11/30
2002/0055329 A1 * 5/2002 Storck, Jr. ................. F24F 7/06 454/186
2006/0243690 A1 11/2006 Mollard
2007/0220912 A1 * 9/2007 Miyamoto ......... H05K 7/20736
2009/0325477 A1 * 12/2009 Hanlon .............. H05K 7/20572 454/238

(Continued)

FOREIGN PATENT DOCUMENTS

CN 201499416 U 6/2016
CN 208285711 U 12/2018
CN 208285725 U 12/2018

*Primary Examiner* — Ko-Wei Lin
(74) *Attorney, Agent, or Firm* — Mackey Law Firm PLLC

(57) ABSTRACT

A computer equipment cabinet cooling system can include a computer equipment cabinet and a cooling sub-system at least partially mounted therein. The cabinet can include multiple equipment bays within an interior space. The cooling sub-system can include one or more fans and/or ducts extending upwardly from a base of the cabinet between the equipment bays. The duct can include one or more vents configured to direct the cold air into the interior space, which can include toward specific portions of the interior space, such as the first and/or second equipment bays.

20 Claims, 8 Drawing Sheets

(56) References Cited

U.S. PATENT DOCUMENTS

| | | | | |
|---|---|---|---|---|
| 2011/0267767 | A1* | 11/2011 | Sun | H05K 7/20736 361/679.46 |
| 2011/0267770 | A1* | 11/2011 | Sun | H05K 7/20727 361/679.49 |
| 2012/0057298 | A1* | 3/2012 | Wei | H05K 7/20754 361/679.49 |
| 2012/0174612 | A1* | 7/2012 | Madara | F24F 3/147 165/104.14 |
| 2013/0267160 | A1* | 10/2013 | Hung | H05K 7/20736 454/184 |
| 2014/0059946 | A1* | 3/2014 | Gardner | E04H 5/00 52/64 |
| 2017/0155984 | A1* | 6/2017 | Ting | H04R 1/2811 |
| 2017/0347499 | A1* | 11/2017 | Ross | F24F 11/77 |
| 2018/0228057 | A1* | 8/2018 | Beall | B21D 39/00 |
| 2019/0380229 | A1* | 12/2019 | Beall | H05K 7/1488 |
| 2021/0153375 | A1 | 5/2021 | Bailey et al. | |
| 2021/0318735 | A1* | 10/2021 | Barbour | H04Q 1/035 |
| 2023/0284424 | A1* | 9/2023 | Heydari | H05K 7/20509 361/679.53 |

* cited by examiner

COOLING SYSTEMS FOR COMPUTER EQUIPMENT CABINETS

CROSS REFERENCE TO RELATED APPLICATIONS

This application claims the benefit of Indian provisional patent application number 202221036139 filed Jun. 23, 2022, the entire contents of which are incorporated herein by reference.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The present disclosure relates generally to computer equipment cabinets and more specifically relates to cooling systems for computer equipment cabinets.

Description of the Related Art

Computer equipment cabinets often have cooling systems mounted to their side walls and/or doors. Cabinets with such systems mounted thereon can have stability and/or structural problems. Furthermore, cabinets with such systems mounted thereon typically require a larger footprint than the cabinet itself. There is a need in the art for improved cooling systems for maintaining the structural stability and footprint of computer equipment cabinets and the like.

BRIEF SUMMARY OF THE INVENTION

Applicants have created new and useful devices, systems and methods for cooling computer equipment cabinets and the like. In at least one embodiment, a computer equipment cabinet cooling system can include a computer equipment cabinet and a cooling sub-system at least partially mounted therein. The cabinet can include a plinth (or a base), first and second side walls extending upwardly from the plinth, with the second side wall being opposite the first side wall, a rear wall extending upwardly from the plinth between the first and second side walls, and a front wall extending upwardly from the plinth between the first and second side walls and opposite the rear wall. The cabinet can include an interior space between the walls. Any of the front, rear, or side walls can include a door, a window, a vent, or any combination thereof.

In at least one embodiment, the cabinet can include one or more equipment bay(s) within the interior space between the walls above the plinth. In at least one embodiment, the cooling sub-system can include one or more fans and/or ducts extending upwardly from the plinth adjacent to the equipment bays, between the walls. The fan(s), duct(s), and/or vent(s) can be configured to blow cold air from the plinth into the interior space, toward the equipment bay(s), and/or away from the equipment bay(s).

In at least one embodiment, the cabinet can include multiple equipment bays within the interior space between the walls above the plinth. For example, in one embodiment, the cabinet can include first and second equipment bays within the interior space above the plinth. In at least one embodiment, the cooling sub-system can include one or more fans and/or ducts extending upwardly from the plinth between the equipment bays. The fan(s) can be configured to blow cold air from the plinth into the interior space.

In at least one embodiment, the system can include a duct extending upwardly from the fan into the interior space between the equipment bays. The duct can include one or more vents configured to direct the cold air into the interior space, or toward specific portions of the interior space, such as the first and/or second equipment bay. For example, in at least one embodiment, the duct can include a first vent configured to direct the cold air toward the first equipment bay and a second vent configured to direct the cold air toward the second equipment bay. In at least one embodiment, the duct can include a vent configured to evenly distribute the cold around the interior space.

In at least one embodiment, the system can include a first duct extending upwardly from a first fan into the interior space between the equipment bays. The first duct can be configured to direct the cold air toward the first equipment bay. In at least one embodiment, the system can include a second fan extending upwardly from the plinth between the equipment bays. The second fan can be configured to blow cold air from the plinth into the interior space. In at least one embodiment, the system can include a second duct extending upwardly from the second fan into the interior space between the equipment bays. The second duct can be configured to direct the cold air toward the second equipment bay. In at least one embodiment, the system can include a third fan extending upwardly from the plinth between the equipment bays. The third fan can be configured to blow cold air from the plinth into the interior space. In at least one embodiment, the system can include a third duct extending upwardly from the third fan into the interior space between the equipment bays. The third duct can be configured to evenly distribute the cold air around the interior space.

In at least one embodiment, the system can include a flexible duct extending upwardly from the any of the fans into the interior space between the equipment bays. In at least one embodiment, the flexible duct can be configured to be adjustable in height, orientation, where it directs cold air, or any combination thereof. In at least one embodiment, the system can include a filter to filter the cold air before it reaches the equipment bays, the fan(s), or any a combination thereof. The filter can be secured to, within, or adjacent to the plinth. For example, in at least one embodiment, the system can include a filter secured to the plinth within a flow path of the cold air upstream of the fan(s). In at least one embodiment, the filter can be secured to the plinth adjacent to any of the fan(s). In at least one embodiment, the filter can be disposed within the plinth adjacent to any of the fan(s). In at least one embodiment, the filter can be disposed between the plinth and any of the fan(s). In at least one embodiment, the system can include a duct within the plinth between the fan(s) and the filter.

In at least one embodiment, the system can include a discharge vent through the plinth configured to receive warm air from the interior space. The discharge vent can be configured to transmit the warm air into the plinth, where it may be discharged into the surrounding environment, or directly into the surrounding environment. In at least one embodiment, any of the fans and/or ducts can be rearranged. For example, in at least one embodiment, the system can include a duct extending upwardly from the plinth into the interior space between the equipment bays and a fan extending from that duct.

In at least one embodiment, a computer equipment cabinet cooling system can include a computer equipment cabinet and a cooling sub-system at least partially mounted therein. The cabinet can include a plinth (or a base), first and second side walls extending upwardly from the plinth, opposite each other, a rear wall extending upwardly from the plinth between the first and second side walls, and a front wall extending upwardly from the plinth between the first and second side walls and opposite the rear wall. The cabinet can include an interior space between the walls. Any of the front, rear, or side walls can include a door, a window, a vent, or any combination thereof. In at least one embodiment, the cabinet can include multiple equipment bays within the interior space between the walls above the plinth. For example, in one embodiment, the cabinet can include first and second equipment bays within the interior space above the plinth.

In at least one embodiment, the cooling sub-system can include one or more fans and/or ducts extending upwardly from the plinth between the equipment bays. The fan(s) and/or duct(s) can be configured to blow cold air from the plinth into the interior space. In at least one embodiment, the cooling sub-system can include multiple fan and duct combinations extending upwardly from the plinth between the equipment bays to blow cold air from the plinth into various portions of the interior space. For example, a first duct can include a first vent configured to direct the cold air toward the first equipment bay, a second duct can include a second vent configured to direct the cold air toward the second equipment bay, a third duct can include a third vent configured to evenly distribute the cold air around the interior space, a fourth duct can be adjustable in height and/or orientation allowing a user to direct cold air where needed.

In at least one embodiment, the cooling sub-system can include a filter secured to the plinth within a flow path of the cold air upstream of the fans. For example, in at least one embodiment, the cooling sub-system can include another duct within the plinth between the filter and the fan(s). In at least one embodiment, the cooling sub-system can include a discharge vent through the plinth configured to receive warm air from the interior space and transmit the warm air into the plinth and/or the surrounding environment.

DETAILED DESCRIPTION OF THE INVENTION

Figure 1:
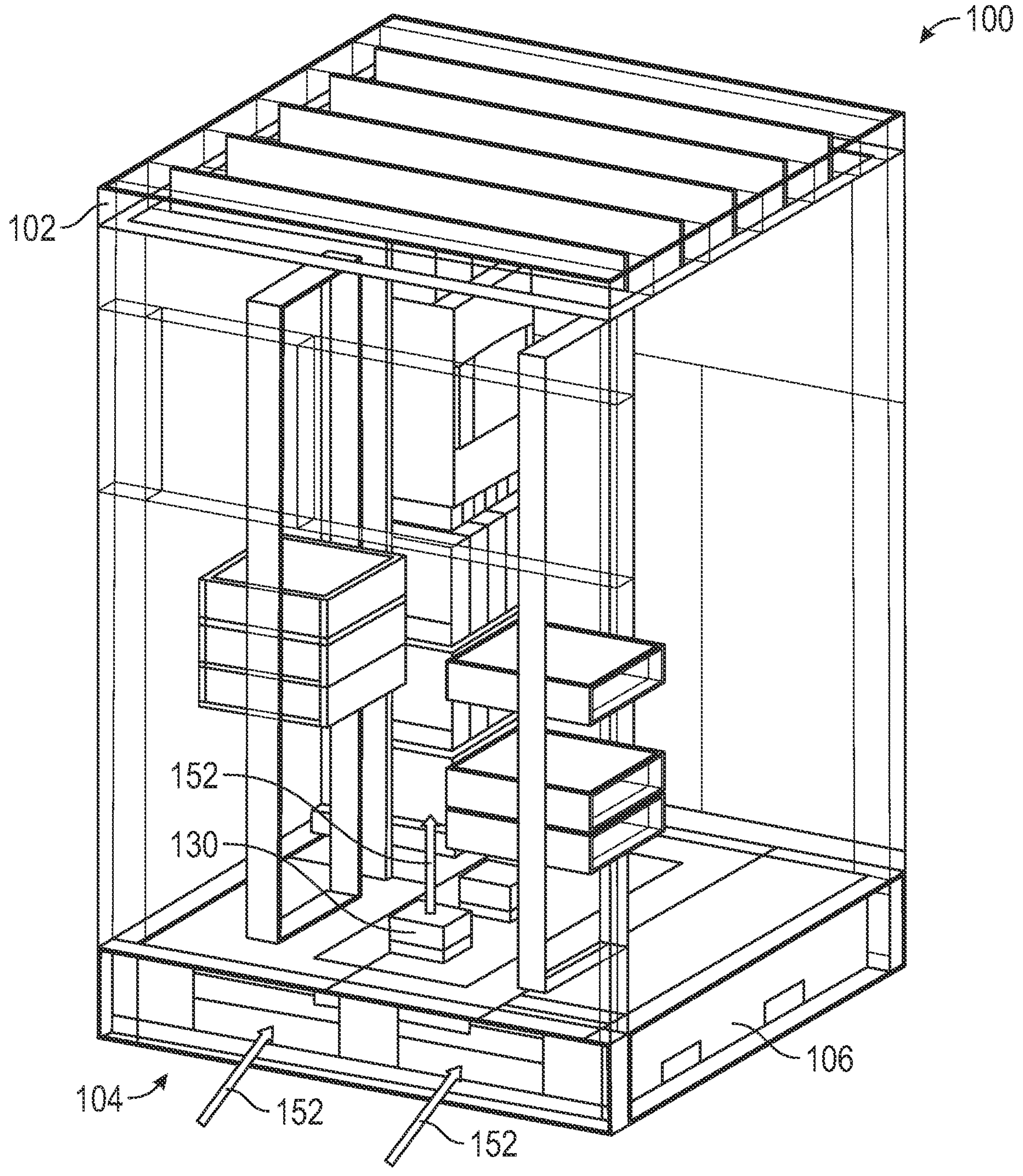
FIG. 1 is a partial perspective view of one of many embodiments of a computer equipment cabinet cooling system according to the disclosure.

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others.

Any process flowcharts discussed herein illustrate the operation of possible implementations of systems, methods, and computer program products according to various embodiments of the present disclosure. In this regard, each block in a flowchart may represent a module, segment, or portion of code, which can include one or more executable instructions for implementing the specified logical function(s). It should also be noted that, in some implementations, the function(s) noted in the block(s) might occur out of the order depicted in the figures. For example, blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Applicants have created new and useful devices, systems and methods for cooling computer equipment cabinets and the like. A computer equipment cabinet cooling system can include a computer equipment cabinet and a cooling sub-system at least partially mounted therein. The cabinet can include multiple equipment bays within an interior space. The cooling sub-system can include one or more fans and/or ducts extending upwardly from a base of the cabinet between the equipment bays. The duct can include one or more vents configured to direct the cold air into the interior space, or toward specific portions of the interior space, such as the first and/or second equipment bay.

Figure 2:
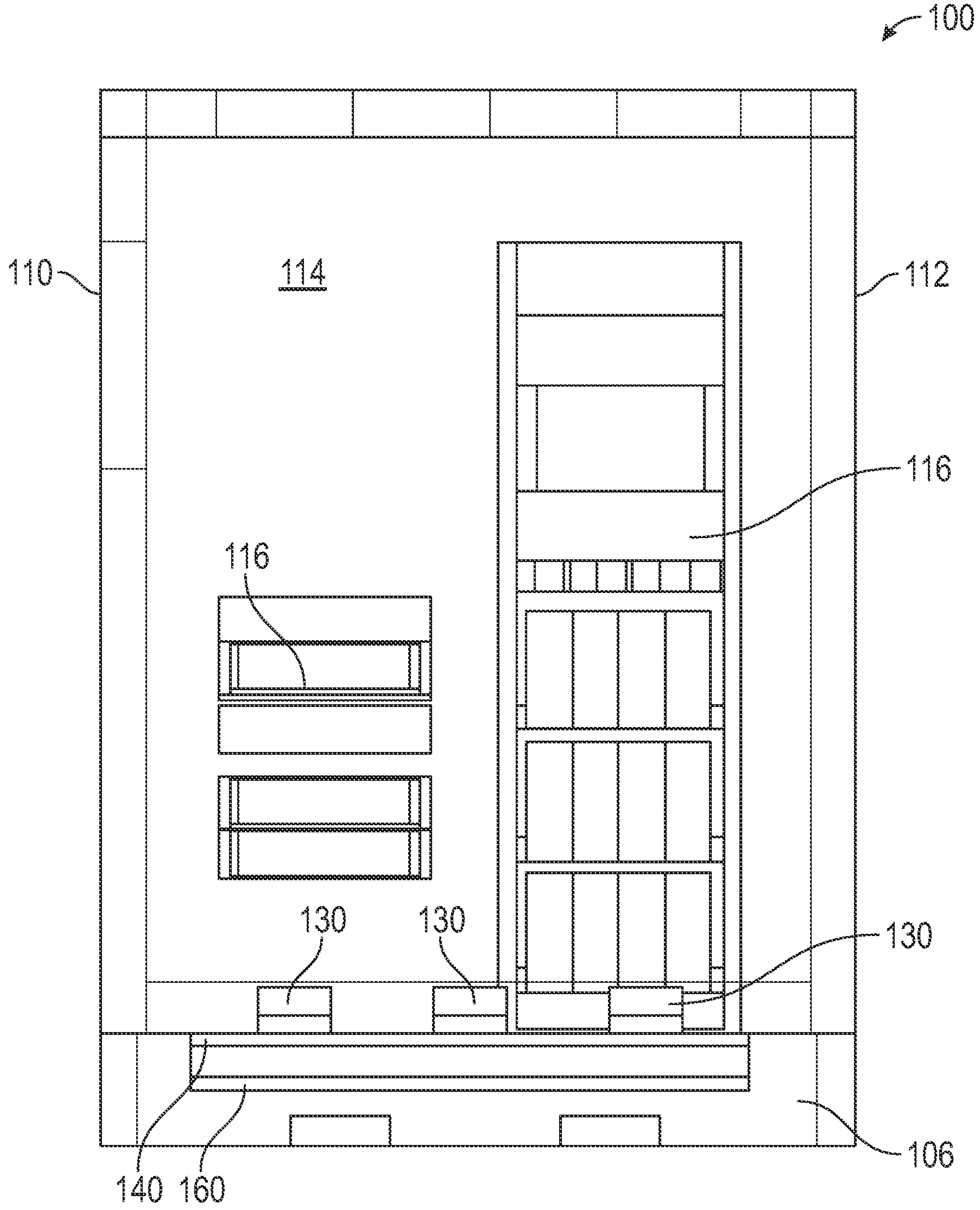
FIG. 2 is a partial elevational view of one of many embodiments of a computer equipment cabinet cooling system according to the disclosure.
Figure 3:
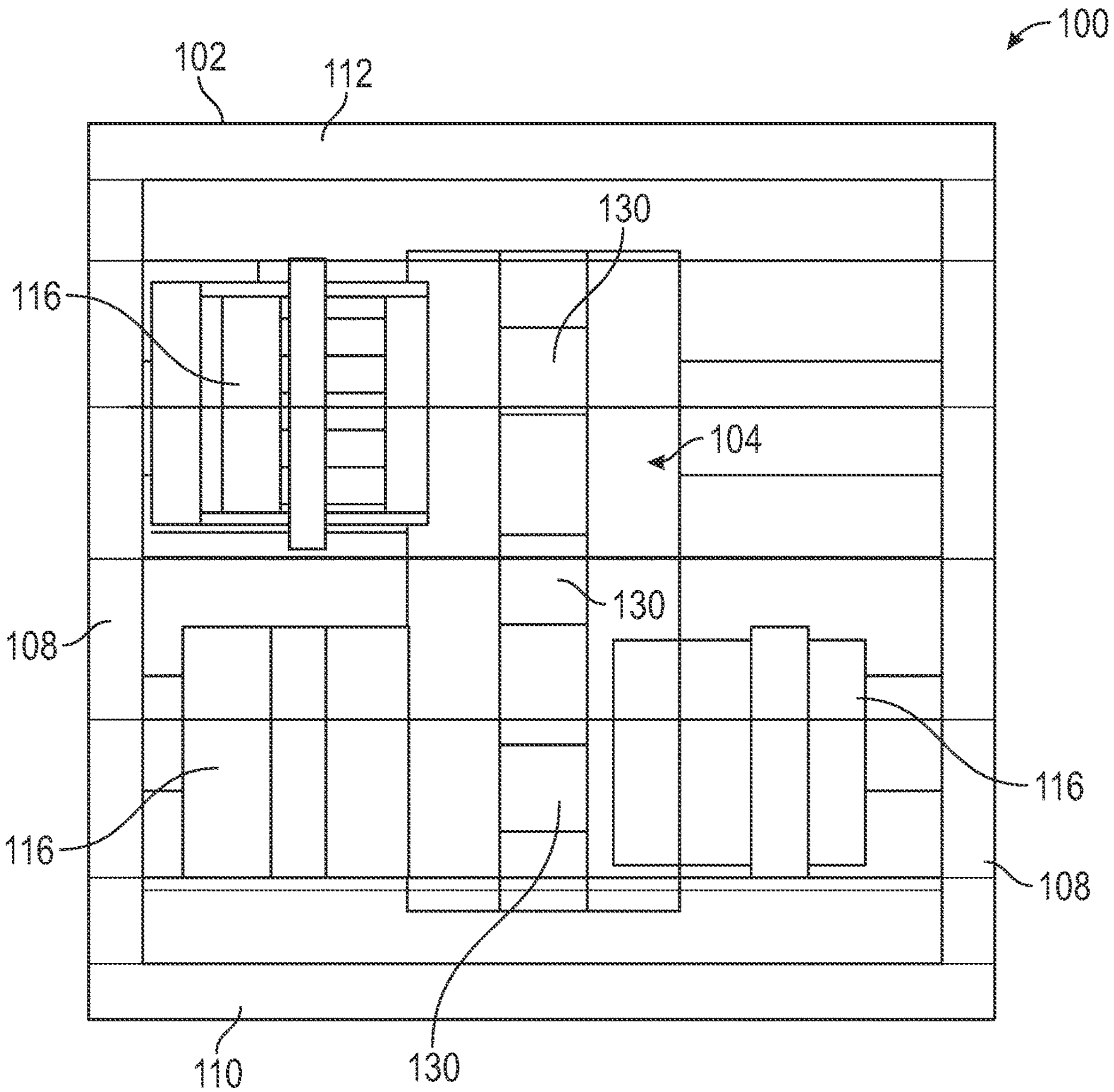
FIG. 3 is a partial plan view of one of many embodiments of a computer equipment cabinet cooling system according to the disclosure.
Figure 4:
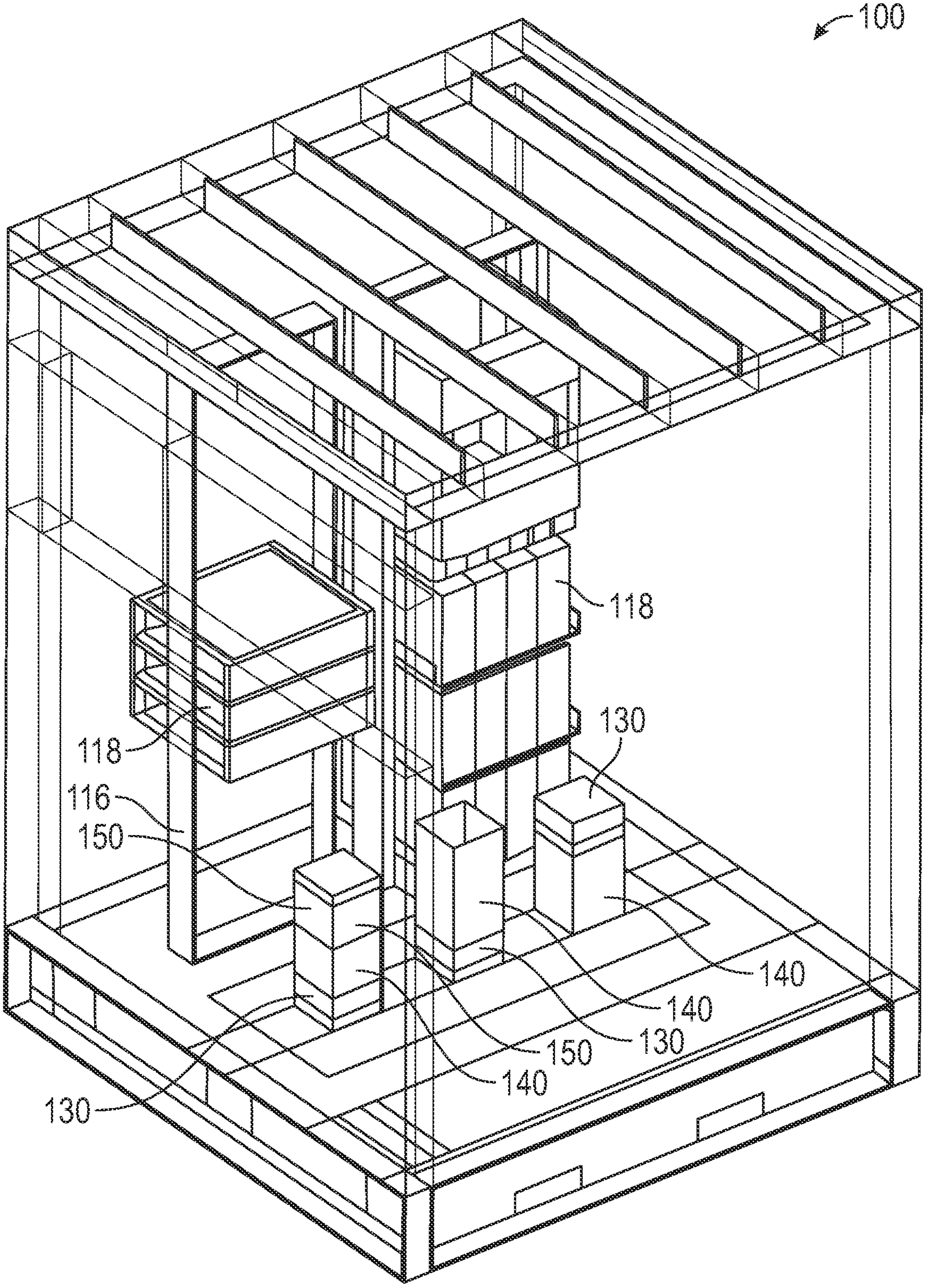
FIG. 4 is a partial perspective view of another one of many embodiments of a computer equipment cabinet cooling system according to the disclosure.
Figure 5:
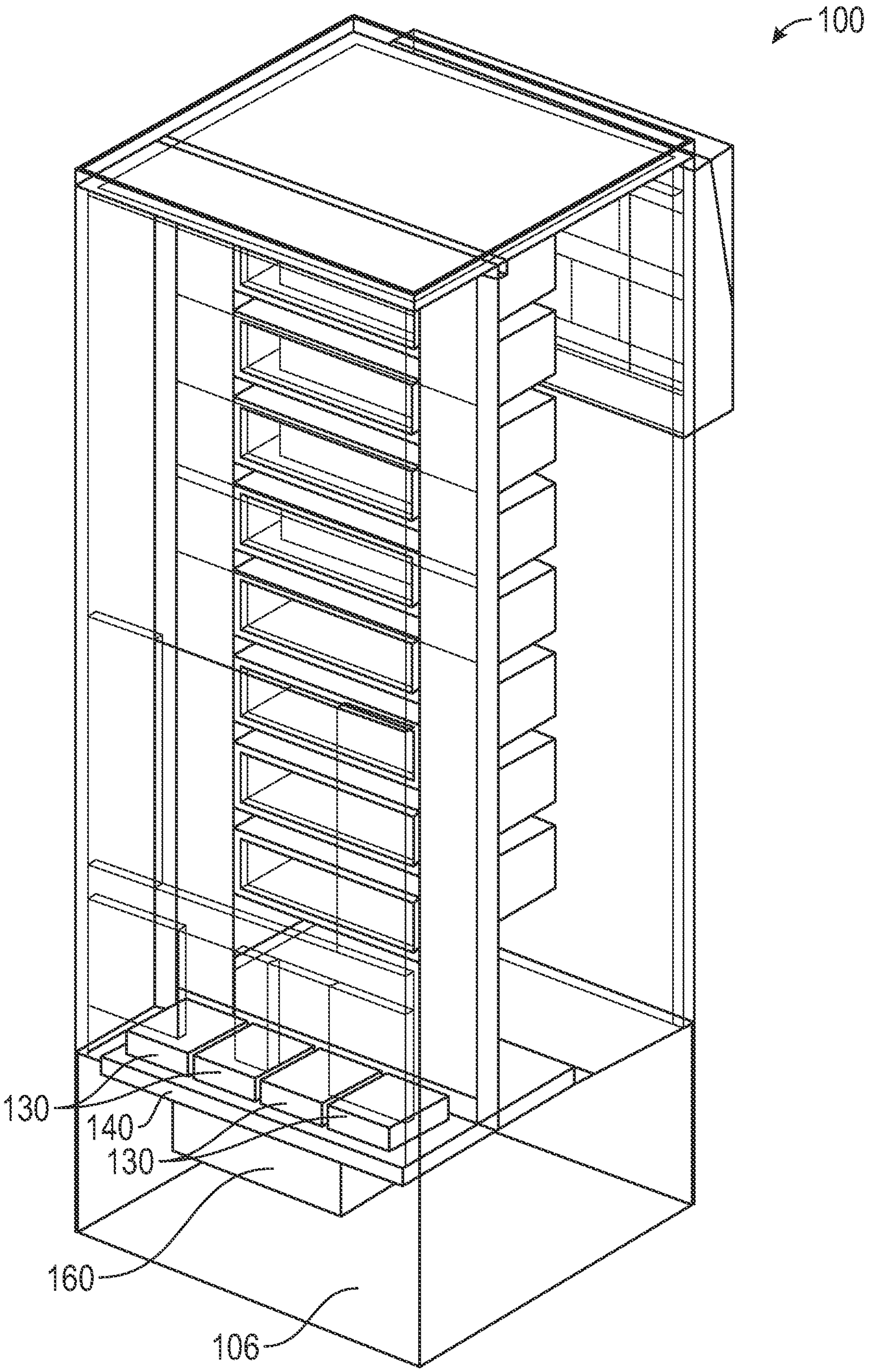
FIG. 5 is a partial perspective view of another one of many embodiments of a computer equipment cabinet cooling system according to the disclosure.
Figure 6:
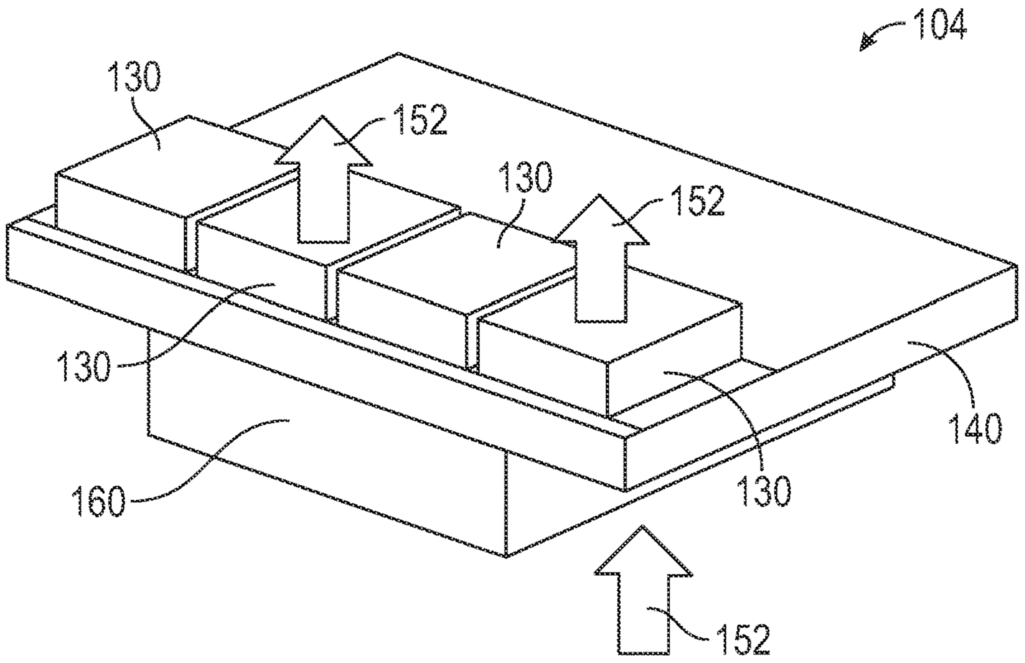
FIG. 6 is a partial perspective view of one of many embodiments of a subassembly of a computer equipment cabinet cooling system according to the disclosure.
Figure 7:
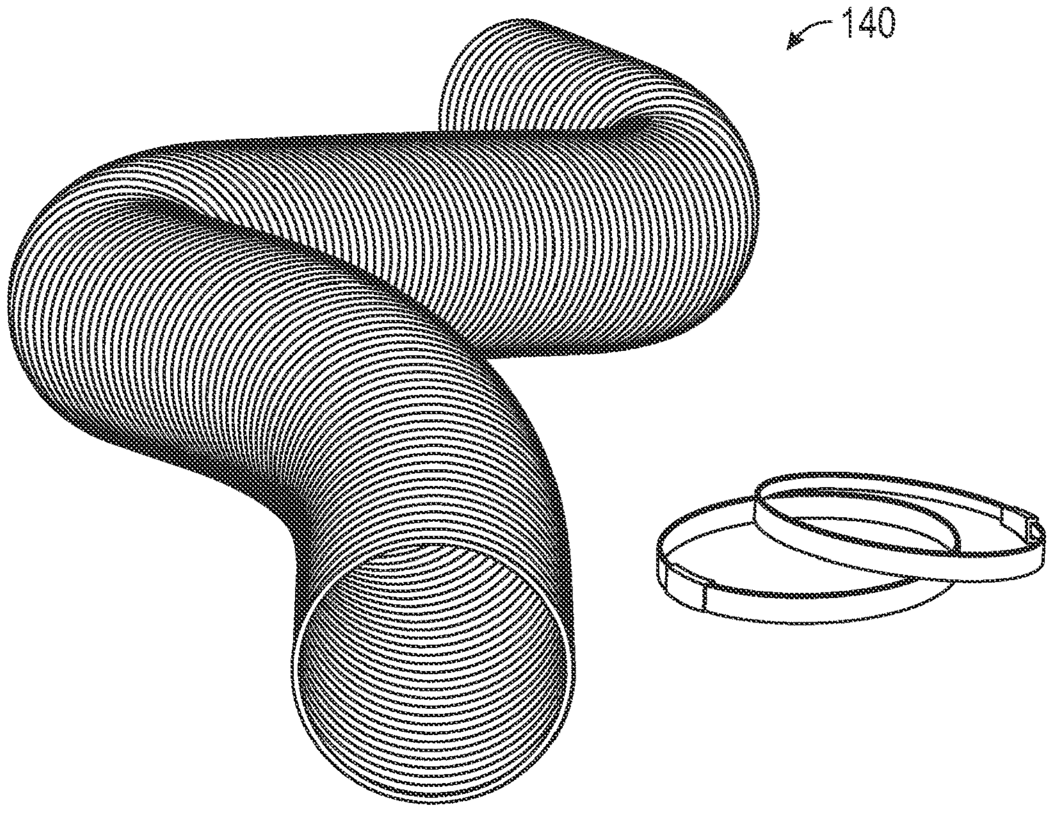
FIG. 7 is a partial perspective view of one of many embodiments of a flexible duct of a computer equipment cabinet cooling system according to the disclosure.
Figure 8:
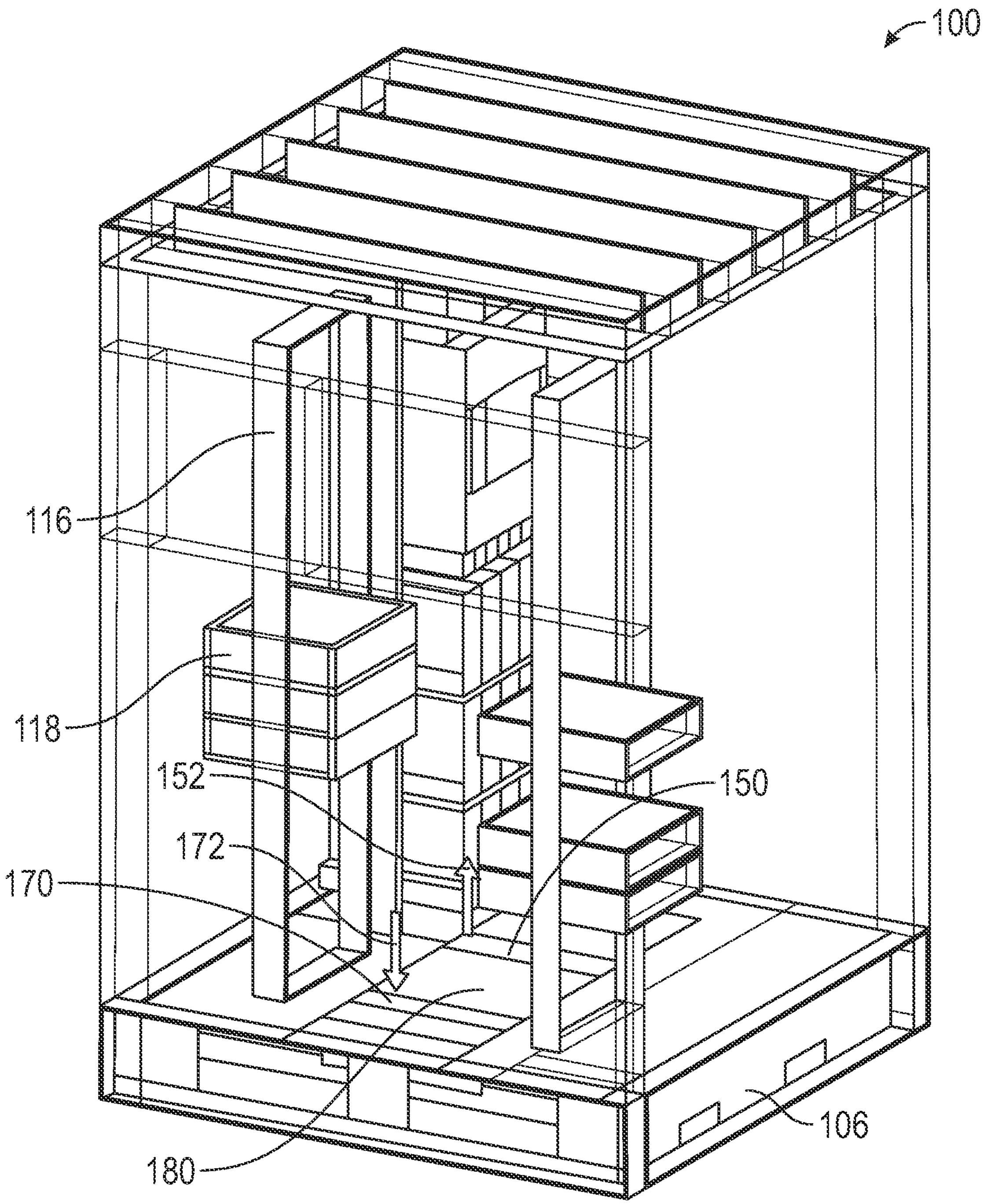
FIG. 8 is a partial perspective view of still another of many embodiments of a computer equipment cabinet cooling system according to the disclosure.
Figure 9:
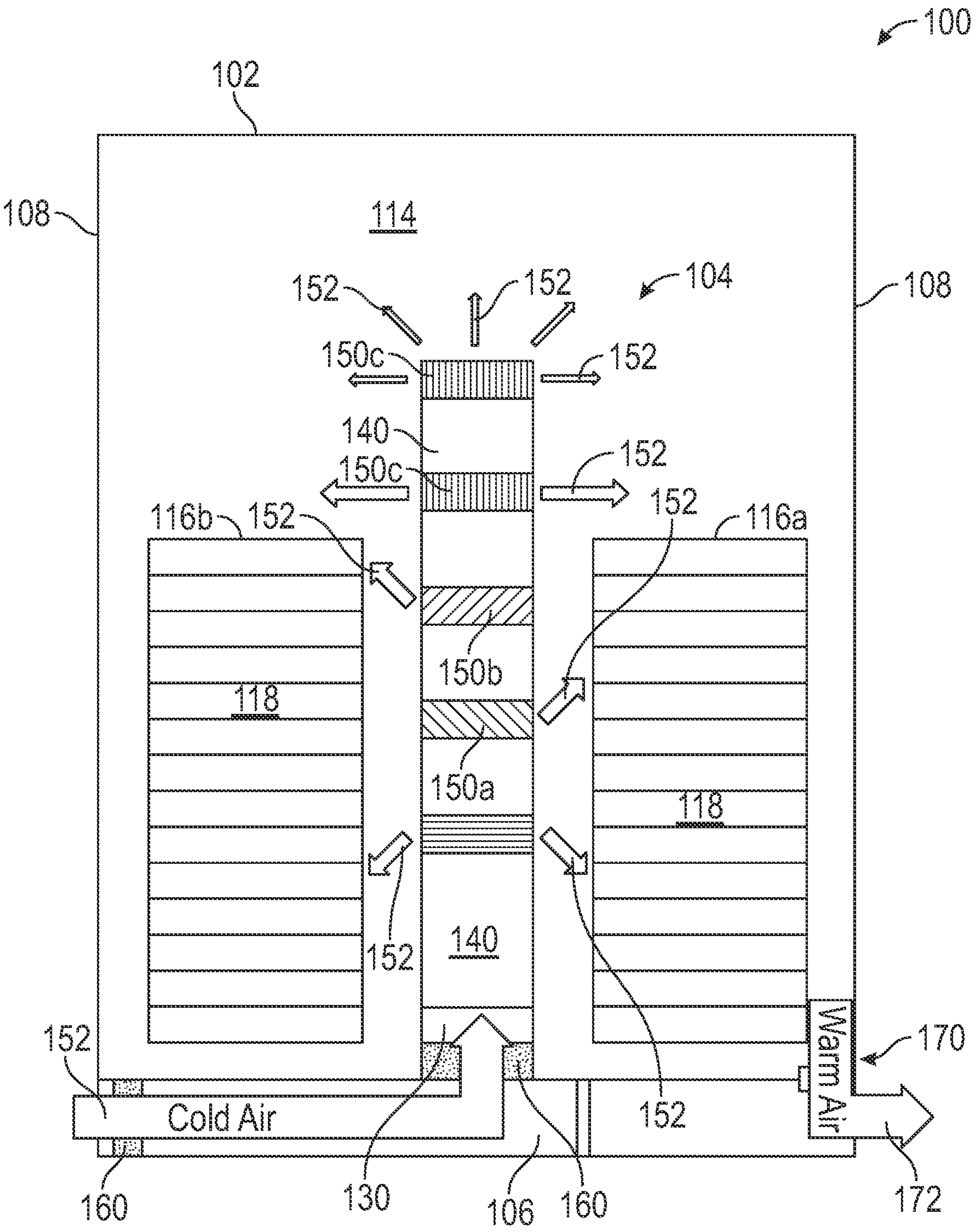
FIG. 9 is a partial elevation view of yet another of many embodiments of a computer equipment cabinet cooling system according to the disclosure.

FIG. 1 is a partial perspective view of one of many embodiments of a computer equipment cabinet cooling system according to the disclosure. FIG. 2 is a partial elevational view of one of many embodiments of a computer equipment cabinet cooling system according to the disclosure. FIG. 3 is a partial plan view of one of many embodiments of a computer equipment cabinet cooling system according to the disclosure. FIG. 4 is a partial perspective view of another one of many embodiments of a computer equipment cabinet cooling system according to the disclosure. FIG. 5 is a partial perspective view of another one of many embodiments of a computer equipment cabinet cooling system according to the disclosure. FIG. 6 is a partial perspective view of one of many embodiments of a subassembly of a computer equipment cabinet cooling system according to the disclosure. FIG. 7 is a partial perspective view of one of many embodiments of a flexible duct of a computer equipment cabinet cooling system according to the disclosure. FIG. 8 is a partial perspective view of still another of many embodiments of a computer equipment cabinet cooling system according to the disclosure. FIG. 9 is a partial elevation view of yet another of many embodiments of a computer equipment cabinet cooling system according to the disclosure. FIGS. 1-9 are described in conjunction with one another.

In at least one embodiment, a computer equipment cabinet cooling system 100 can include a computer equipment cabinet 102 and a cooling sub-system 104 at least partially mounted therein. The cabinet 102 can include a plinth (or a base) 106, first and second side walls 108 extending upwardly from the plinth 106, with the second side wall being opposite the first side wall, a rear wall 110 extending upwardly from the plinth 106 between the first and second side walls 108, and a front wall 112 extending upwardly from the plinth 106 between the first and second side walls 108 and opposite the rear wall 110. The cabinet 102 can include an interior space 114 between the walls. Any of the front, rear, or side walls can include a door, a window, a vent, or any combination thereof.

In at least one embodiment, the cabinet 102 can include one or more equipment bays 116 within the interior space 114 between the walls above the plinth 106. For example, in at least one embodiment, the cabinet 102 can include one equipment bay 116 within the interior space 114 above the plinth 106. In at least one embodiment, the cabinet 102 can include first and second equipment bays 116 within the interior space 114 above the plinth 106. In at least one embodiment, the cabinet 102 can include three equipment bays 116 within the interior space 114 between the walls above the plinth 106. In at least one embodiment, the cabinet 102 can include between two and four equipment bays 116 within the interior space 114 between the walls above the plinth 106. In at least one embodiment, the cabinet 102 can include four or more equipment bays 116 within the interior space 114 between the walls above the plinth 106.

In at least one embodiment, the equipment bay(s) 116 can include various computing equipment and components supporting computing equipment 118, such as servers, power supplies, network attached storage devices, switches, routers, and the like. Such devices may be spread throughout the equipment bays 116, or confined to specific ones of the equipment bays 116. For example, in at least one embodiment, a first equipment bay 116 can contain power supply equipment, a second equipment bay 116 can contain servers, a third equipment bay 116 can contain storage devices, and a fourth equipment bay 116 can contain networking components. In at least one embodiment, one or more of the equipment bays 116 contains a combination of equipment 118.

In at least one embodiment, the cooling sub-system 104 can include one or more fans 130 and/or ducts 140 extending upwardly from the plinth 106 between the equipment bays 116. The fan(s) 130 and/or ducts 140 can be configured to blow and/or direct cold air from the plinth 106 into the interior space 114. The fan(s) 130, duct(s) 140, and/or vent(s) 150 can be configured to blow cold air 152 from the plinth into the interior space, toward the equipment bay(s) 116, and/or away from the equipment bay(s) 116.

In at least one embodiment, the system 100 can include a duct 140 extending upwardly from a fan 130 into the interior space 114 between the equipment bays 116. The duct 140 can include one or more vents 150 configured to direct the cold air 152 into the interior space 114, or toward specific portions of the interior space 114, such as the first equipment bay and/or second equipment bay 116. For example, in at least one embodiment, the duct 140 can include a first vent 150*a* configured to direct the cold air 152 toward the first equipment bay 116*a* and a second vent 150*b* configured to direct the cold air 152 toward the second equipment bay 116*b*. In at least one embodiment, the duct 140 can include a vent 150*c* configured to evenly distribute the cold air 152 around the interior space 114. In at least one embodiment, the duct 140 can include multiple vents 150. In at least one embodiment, multiple ducts 140 can include one or more vent(s) 150 each, with each vent directing the cold air 152 to one or more locations within the interior space 114. In at least one embodiment, the vents 150 can be perforations or louvers in the duct(s) 140. In at least one embodiment, one duct 140 can extend from multiple fans 130 and include multiple the vents 150.

In at least one embodiment, the system 100 can include one or more fan(s) 130 and/or duct(s) 140, each with one or more vent(s) 150 each, with each vent directing the cold air 152 to one or more locations within the interior space 114. For example, in at least one embodiment, the system 100 can include a first duct 140 extending upwardly from a first fan 130 into the interior space 114 between the equipment bays 116. The first duct 140 can be configured to direct the cold air 152 toward the first equipment bay 116. In at least one embodiment, the system 100 can include a second fan 130 extending upwardly from the plinth 106 between the equipment bays 116. The second fan 130 can be configured to blow cold air 152 from the plinth 106 into the interior space 114. In at least one embodiment, the system 100 can include a second duct 140 extending upwardly from the second fan 130 into the interior space 114 between the equipment bays 116. The second duct 140 can be configured to direct the cold air 152 toward the second equipment bay 116. In at least one embodiment, the system 100 can include a third fan 130 extending upwardly from the plinth 106 between the equipment bays 116. The third fan 130 can be configured to blow cold air 152 from the plinth 106 into the interior space 114. In at least one embodiment, the system 100 can include a third duct 140 extending upwardly from the third fan 130 into the interior space 114 between the equipment bays 116. The third duct 140 can be configured to evenly distribute the cold air 152 around the interior space 114.

In at least one embodiment, the system 100 can include a flexible duct 140 extending upwardly from the any of the fans 130 into the interior space 114 between the equipment bays 116. In at least one embodiment, the flexible duct 140 can be configured to be adjustable in height, orientation, or any combination thereof. For example, in at least one embodiment, the flexible duct 140 can be supported by a guiding rod extending upwardly from the plinth 106 into the interior space 114 between the equipment bays 116. The flexible duct 140 can be adjustably secured to the guiding rod by conventional means, such as screws, clamps, or the like. In at least one embodiment, one or more duct(s) 140 can be rigid and/or made from sheet metal, which may or may not provide some adjustability in orientation and/or height. In at least one embodiment, one or more duct(s) 140 can be flexible conduit or tubing, such as rubber or metal, which not provide substantial adjustability in orientation and/or height, and my therefore allow a user to direct cold air 152 where desired within the interior space 114.

In at least one embodiment, the system 100 can include one or more filter(s) 160 to filter the cold air 152 before it reaches the equipment bays 116, the fan(s) 130, or any a combination thereof. The filter 160 can be secured to, within, or adjacent to the plinth 106. For example, in at least one embodiment, filter 160 can be secured to the plinth 106 within a flow path of the cold air 152 upstream of the fan(s) 130. In at least one embodiment, the filter 160 can be secured to the plinth 106 adjacent to any of the fan(s) 130. In at least one embodiment, the filter 160 can be disposed within the plinth 106 adjacent to any of the fan(s) 130. In at least one embodiment, the filter 160 can be disposed between the plinth 16 and any of the fan(s) 130. In at least one embodiment, the system 100 can include a filter 160 for each fan 130. In at least one embodiment, the system 100 can include a filter 160 common to multiple fan(s). In at least one embodiment, the system 100 can include a duct 140 at least partially within the plinth 106 between the fan(s) 130 and the filter 160.

In at least one embodiment, the system 100 can include one or more discharge vents 170 in or through the plinth 106 configured to receive warm air from the interior space 114. One or more discharge vents 170 can be configured to transmit the warm air 172 into the plinth 106, where it may be discharged into the surrounding environment, or directly into the surrounding environment, e.g., through a wall or other portion of cabinet 102. In at least one embodiment, the plinth 106 contains a heat exchanger 180 therein. In at least one embodiment, the heat exchanger 180 accepts the warm air 172 through one or more discharge vents 170 and supplies cold air 152 to the filter(s) 160, fan(s) 130, duct(s) 140, vents 150, or any combination thereof.

In at least one embodiment, the any of the fan(s) 130 and/or duct(s) 140 can be rearranged. For example, in at least one embodiment, the system 100 can include a duct 140 extending upwardly from the plinth 106 into the interior space 114 between the equipment bays 116 and a fan 130 extending from that duct 140. In at least one embodiment, a duct 140 extending upwardly from the plinth 106 into the interior space 114 between the equipment bays 116 can have multiple fan(s) 130 extending therefrom. Each such fan 130 can be configured to direct the cold air 152 to a different location(s) within the interior space 114.

In at least one embodiment, a computer equipment cabinet cooling system 100 can include a computer equipment cabinet 102 and a cooling sub-system 104 at least partially mounted therein. The cabinet 102 can include a plinth (or a base) 106, first and second side walls 108 extending upwardly from the plinth 106, opposite each other, a rear wall 110 extending upwardly from the plinth 106 between the first and second side walls 108, and a front wall 112 extending upwardly from the plinth 106 between the first and second side walls 108 and opposite the rear wall 110. The cabinet 102 can include an interior space 114 between the walls. Any of the front, rear, or side walls can include a door, a window, a vent, or any combination thereof.

In at least one embodiment, the cabinet 102 can include one or more equipment bays 116 within the interior space 114 between the walls above the plinth 106. For example, in one embodiment, the cabinet 102 can include first and second equipment bays 116 within the interior space 114 above the plinth 106. In at least one embodiment, the cabinet 102 can between two and four equipment bays 116 within the interior space 114 between the walls above the plinth 106. In at least one embodiment, the cabinet 102 can include four or more equipment bays 116 within the interior space 114 between the walls above the plinth 106.

In at least one embodiment, the cooling sub-system 104 can include one or more fans 130 and/or ducts 140 extending upwardly from the plinth 106 between the equipment bays 116. The fan(s) 130 and/or duct(s) 140 can be configured to blow cold air 152 from the plinth 106 into the interior space 114. In at least one embodiment, the cooling sub-system 104 can include multiple fan and duct combinations extending upwardly from the plinth 106 between the equipment bays 116 to blow cold air 152 from the plinth 106 into various portions of the interior space 114. For example, a first duct 140 can include a first vent 150 configured to direct the cold air 152 toward the first equipment bay 116, a second duct 140 can include a second vent 150 configured to direct the cold air 152 toward the second equipment bay 116, a third duct 140 can include a third vent 150 configured to evenly distribute the cold air 152 around the interior space, a fourth duct 140 can be adjustable in height and/or orientation allowing a user to direct cold air 152 where needed.

In at least one embodiment, the cooling sub-system 104 can include a filter 160 secured to the plinth 106 within a flow path of the cold air 152 upstream of the fans 130. For example, in at least one embodiment, the cooling sub-system 104 can include another duct 140 within the plinth 106 between the filter 160 and the fan(s) 130. In at least one embodiment, the cooling sub-system 104 can include a discharge vent 170 through the plinth 106 configured to receive warm air 172 from the interior space 114 and transmit the warm air 172 into the plinth 106 and/or the surrounding environment. In at least one embodiment, the cooling sub-system 104 can include a heat exchanger 180 at least partially withing the plinth 106 to cool the warm air 172, and thereby return the cold air 152 to the interior space 114.

In at least one embodiment, a computer equipment cabinet cooling system can include a computer equipment cabinet and a cooling sub-system at least partially mounted therein. The cabinet can include a plinth (or a base), first and second side walls extending upwardly from the plinth, with the second side wall being opposite the first side wall, a rear wall extending upwardly from the plinth between the first and second side walls, and a front wall extending upwardly from the plinth between the first and second side walls and opposite the rear wall. The cabinet can include an interior space between the walls. Any of the front, rear, or side walls can include a door, a window, a vent, or any combination thereof.

In at least one embodiment, the cabinet can include an equipment bay within the interior space between the walls above the plinth. In at least one embodiment, the cabinet can include multiple equipment bays within the interior space between the walls above the plinth. For example, in one embodiment, the cabinet can include first and second equipment bays within the interior space above the plinth.

In at least one embodiment, the cooling sub-system can include one or more fans and/or ducts extending upwardly from the plinth between the equipment bays. The fan(s) can be configured to blow cold air from the plinth into the interior space. The fan(s), duct(s), and/or vent(s) can be configured to blow cold air from the plinth into the interior space, toward the equipment bay(s), and/or away from the equipment bay(s).

In at least one embodiment, the system can include a duct extending upwardly from the fan into the interior space between the equipment bays. The duct can include one or more vents configured to direct the cold air into the interior space, or toward specific portions of the interior space, such as the first and/or second equipment bay. For example, in at least one embodiment, the duct can include a first vent configured to direct the cold air toward the first equipment bay and a second vent configured to direct the cold air toward the second equipment bay. In at least one embodiment, the duct can include a vent configured to evenly distribute the cold around the interior space.

In at least one embodiment, the system can include a first duct extending upwardly from a first fan into the interior space between the equipment bays. The first duct can be configured to direct the cold air toward the first equipment bay. In at least one embodiment, the system can include a second fan extending upwardly from the plinth between the equipment bays. The second fan can be configured to blow cold air from the plinth into the interior space. In at least one embodiment, the system can include a second duct extending upwardly from the second fan into the interior space between the equipment bays. The second duct can be configured to direct the cold air toward the second equipment bay. In at least one embodiment, the system can include a third fan extending upwardly from the plinth between the equipment bays. The third fan can be configured to blow cold air from the plinth into the interior space. In at least one embodiment, the system can include a third duct extending upwardly from the third fan into the interior space between the equipment bays. The third duct can be configured to evenly distribute the cold air around the interior space.

In at least one embodiment, the system can include a flexible duct extending upwardly from the any of the fans into the interior space between the equipment bays. In at least one embodiment, the flexible duct can be configured to be adjustable in height, orientation, where it directs cold air, or any combination thereof.

In at least one embodiment, the system can include a filter to filter the cold air before it reaches the equipment bays, the fan(s), or any a combination thereof. The filter can be secured to, within, or adjacent to the plinth. For example, in at least one embodiment, filter secured to the plinth within a flow path of the cold air upstream of the fan(s). In at least one embodiment, the filter can be secured to the plinth adjacent to any of the fan(s). In at least one embodiment, the filter can be disposed within the plinth adjacent to any of the fan(s). In at least one embodiment, the filter can be disposed between the plinth and any of the fan(s). In at least one embodiment, the system can include a duct within the plinth between the fan(s) and the filter.

In at least one embodiment, the system can include a discharge vent through the plinth configured to receive warm air from the interior space. The discharge vent can be configured to transmit the warm air into the plinth, where it may be discharged into the surrounding environment, or directly into the surrounding environment.

In at least one embodiment, the any of the fans and/or ducts can be rearranged. For example, in at least one embodiment, the system can include a duct extending upwardly from the plinth into the interior space between the equipment bays and a fan extending from that duct.

In at least one embodiment, a computer equipment cabinet cooling system can include a computer equipment cabinet and a cooling sub-system at least partially mounted therein. The cabinet can include a plinth (or a base), first and second side walls extending upwardly from the plinth, opposite each other, a rear wall extending upwardly from the plinth between the first and second side walls, and a front wall extending upwardly from the plinth between the first and second side walls and opposite the rear wall. The cabinet can include an interior space between the walls. Any of the front, rear, or side walls can include a door, a window, a vent, or any combination thereof.

In at least one embodiment, the cabinet can include multiple equipment bays within the interior space between the walls above the plinth. For example, in one embodiment, the cabinet can include first and second equipment bays within the interior space above the plinth.

In at least one embodiment, the cooling sub-system can include one or more fans and/or ducts extending upwardly from the plinth between the equipment bays. The fan(s) and/or duct(s) can be configured to blow cold air from the plinth into the interior space. In at least one embodiment, the cooling sub-system can include multiple fan and duct combinations extending upwardly from the plinth between the equipment bays to blow cold air from the plinth into various portions of the interior space. For example, a first duct can include a first vent configured to direct the cold air toward the first equipment bay, a second duct can include a second vent configured to direct the cold air toward the second equipment bay, a third duct can include a third vent configured to evenly distribute the cold air around the interior space, a fourth duct can be adjustable in height and/or orientation allowing a user to direct cold air where needed.

In at least one embodiment, the cooling sub-system can include a filter secured to the plinth within a flow path of the cold air upstream of the fans. For example, in at least one embodiment, the cooling sub-system can include another duct within the plinth between the filter and the fan(s). In at least one embodiment, the cooling sub-system can include a discharge vent through the plinth configured to receive warm air from the interior space and transmit the warm air into the plinth and/or the surrounding environment.

Other and further embodiments utilizing one or more aspects of the disclosure can be devised without departing from the spirit of Applicants' disclosure. For example, the devices, systems and methods can be implemented for numerous different types and sizes in numerous different industries. Further, the various methods and embodiments of the devices, systems and methods can be included in combination with each other to produce variations of the disclosed methods and embodiments. Discussion of singular elements can include plural elements and vice versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicants, but rather, in conformity with the patent laws, Applicants intend to fully protect all such modifications and improvements that come within the scope or range of equivalents of the following claims.

What is claimed is:

1. A cooling system, comprising:

a computer equipment cabinet, the cabinet comprising a plinth, a first side wall extending upwardly from the plinth, a second side wall extending upwardly from the plinth opposite the first side wall, a rear wall extending upwardly from the plinth between the first and second side walls, a front wall extending upwardly from the plinth between the first and second side walls and opposite the rear wall, and an interior space;

a first equipment bay within the interior space above the plinth;

a second equipment bay within the interior space above the plinth;

a first fan extending upwardly from the plinth between the equipment bays, the first fan configured to blow cold air from the plinth into the interior space; and a first duct extending upwardly from the first fan into the interior space between the equipment bays.

2. The system of claim 1, wherein the first duct includes a first vent configured to direct the cold air toward the first equipment bay.

3. The system of claim 2, wherein the first duct includes a second vent configured to direct the cold air toward the second equipment bay.

4. The system of claim 2, wherein the first duct includes a second vent configured to evenly distribute the cold around the interior space.

5. The system of claim 1, wherein the first duct is configured to direct the cold air toward the first equipment bay and further comprising a second fan extending upwardly from the plinth between the equipment bays, the second fan configured to blow cold air from the plinth into the interior space; and a second duct extending upwardly from the second fan into the interior space between the equipment bays and configured to direct the cold air toward the second equipment bay.

6. The system of claim 5, further comprising a third fan extending upwardly from the plinth between the equipment bays, the third fan configured to blow cold air from the plinth into the interior space; and a third duct extending upwardly from the third fan into the interior space between the equipment bays and configured to evenly distribute the cold air around the interior space.

7. The system of claim 1, wherein the first duct is a flexible duct configured to be adjustable in height and orientation.

8. The system of claim 1, further comprising a filter secured to the plinth adjacent to the first fan.

9. The system of claim 8, wherein the filter is disposed within the plinth adjacent to the first fan.

10. The system of claim 8, wherein the filter is disposed between the plinth and the first fan.

11. The system of claim 1, further comprising a filter secured to the plinth within a flow path of the cold air upstream of the first fan.

12. The system of claim 11, further comprising a second duct within the plinth between the first fan and the filter.

13. The system of claim 1, further comprising a discharge vent through the plinth configured to receive warm air from the interior space and transmit the warm air into the plinth.

14. The system of claim 1, further comprising a second duct extending upwardly from the plinth into the interior space between the equipment bays; and a second fan extending from the second duct, the second fan configured to blow cold air from the second duct into the interior space.

15. A cooling system, comprising:

a computer equipment cabinet, the cabinet comprising a plinth, a first side wall extending upwardly from the plinth, a second side wall extending upwardly from the plinth opposite the first side wall a rear wall extending upwardly from the plinth between the first and second side walls, a front wall extending upwardly from the plinth between the first and second side walls and opposite the rear wall, and in interior space;

a first equipment bay within the interior space above the plinth;

a second equipment bay within the interior space above the plinth;

a first fan extending upwardly from the plinth between the equipment bays, the first fan configured to blow cold air from the plinth into the interior space;

a first duct extending upwardly from the first fan into the interior space between the equipment bays, wherein the first duct includes a first vent configured to direct the cold air toward the first equipment bay;

a second fan extending upwardly from the plinth between the equipment bays, the second fan configured to blow cold air from the plinth into the interior space;

a second duct extending upwardly from the second fan into the interior space between the equipment bays, wherein the second duct includes a second vent configured to direct the cold air toward the second equipment bay;

a third fan extending upwardly from the plinth between the equipment bays, the third fan configured to blow cold air from the plinth into the interior space;

a third duct extending upwardly from the third fan into the interior space between the equipment bays, wherein the third duct includes a third vent configured to evenly distribute the cold air around the interior space;

a fourth fan extending upwardly from the plinth between the equipment bays, the fourth fan configured to blow cold air from the plinth into the interior space;

a fourth duct extending upwardly from the fourth fan into the interior space between the equipment bays, the fourth duct configured to be adjustable in height and orientation;

a filter secured to the plinth within a flow path of the cold air upstream of the fans;

a fifth duct within the plinth between the filter and the fans; and a discharge vent through the plinth configured to receive warm air from the interior space and transmit the warm air into the plinth.

16. A cooling system, comprising:

a computer equipment cabinet, the cabinet comprising a plinth, a first side wall extending upwardly from the plinth, a second side wall extending upwardly from the plinth opposite the first side wall, a rear wall extending upwardly from the plinth between the first and second side walls, a front wall extending upwardly from the plinth between the first and second side walls and opposite the rear wall, and an interior space;

an equipment bay within the interior space above the plinth;

a first fan adjacent to the equipment bay, between the walls, the first fan configured to blow cold air from the plinth into the interior space; and a discharge vent through the plinth configured to receive warm air from the interior space and transmit the warm air into the plinth.

17. The system of claim 16, further comprising a first duct extending upwardly from the first fan into the interior space between the walls, wherein the first duct includes a first vent configured to direct at least a portion of the cold air toward the equipment bay.

18. The system of claim 17, wherein the first duct includes a second vent configured to direct at least a portion of the cold air away from the equipment bay.

19. The system of claim 16, wherein the first fan extends upwardly from the plinth.

20. The system of claim 17, further comprising a second duct extending upwardly from the plinth into the interior space between the walls; and a second fan extending from the second duct, the second fan configured to blow cold air from the second duct into the interior space.

* * * * *